(12) United States Patent
Ohashi et al.

(10) Patent No.: US 9,426,915 B2
(45) Date of Patent: Aug. 23, 2016

(54) POWER MODULE

(71) Applicant: MITSUBISHI MATERIALS CORPORATION, Tokyo (JP)

(72) Inventors: Touyou Ohashi, Kitamoto (JP); Yoshiyuki Nagatomo, Saitama (JP); Toshiyuki Nagase, Gotenba (JP); Yoshirou Kuromitsu, Saitama (JP)

(73) Assignee: MITSUBISHI MATERIALS CORPORATION, Tokyo (JP)

( * ) Notice: Subject to any disclaimer, the term of this patent is extended or adjusted under 35 U.S.C. 154(b) by 0 days.

(21) Appl. No.: 14/654,159

(22) PCT Filed: Dec. 20, 2013

(86) PCT No.: PCT/JP2013/084329
§ 371 (c)(1),
(2) Date: Jun. 19, 2015

(87) PCT Pub. No.: WO2014/103955
PCT Pub. Date: Jul. 3, 2014

(65) Prior Publication Data
US 2015/0319876 A1    Nov. 5, 2015

(30) Foreign Application Priority Data

Dec. 25, 2012 (JP) ................................ 2012-281346

(51) Int. Cl.
*H05K 7/02* (2006.01)
*B23K 35/26* (2006.01)
(Continued)

(52) U.S. Cl.
CPC .............. *H05K 7/02* (2013.01); *B23K 35/26* (2013.01); *C22C 13/00* (2013.01); *H01L 21/52* (2013.01);
(Continued)

(58) Field of Classification Search
CPC ........................................................ H05K 1/18
USPC .................. 361/761, 782, 780, 764; 333/204
See application file for complete search history.

(56) References Cited

U.S. PATENT DOCUMENTS 8,198,540 B2 * 6/2012 Kuromitsu .......... H01L 23/3735
165/185
2002/0109152 A1 * 8/2002 Kobayashi .......... H01L 23/3735
257/177

(Continued)

FOREIGN PATENT DOCUMENTS

JP    2002-076551 A    3/2002
JP    2003-133474 A    5/2003

(Continued)

OTHER PUBLICATIONS

Office Action mailed Oct. 13, 2015, issued for the Japanese patent application No. 2013-264216 and English translation thereof.

(Continued)

*Primary Examiner* — Timothy Thompson
*Assistant Examiner* — Michael F McAllister
(74) *Attorney, Agent, or Firm* — Locke Lord LLP

(57) ABSTRACT

In a power module according to the present invention, a copper layer composed of copper or a copper alloy is provided at a surface of a circuit layer onto which a semiconductor element is bonded, and a solder layer formed by using a solder material is formed between the circuit layer and the semiconductor element. An alloy layer containing Sn as a main component, 0.5% by mass or more and 10% by mass or less of Ni, and 30% by mass or more and 40% by mass or less of Cu is formed at the interface between the solder layer and the circuit layer, the thickness of the alloy layer is set to be within a range of 2 μm or more and 20 μm or less, and a thermal resistance increase rate is less than 10% after loading a power cycles 100,000 times under a condition where an energization time is 5 seconds and a temperature difference is 80° C. in a power cycle test.

2 Claims, 8 Drawing Sheets

(51) Int. Cl.
*C22C 13/00* (2006.01)
*H01L 21/52* (2006.01)
*H01L 23/373* (2006.01)
*H01L 23/473* (2006.01)
*H01L 23/488* (2006.01)
*H01L 23/00* (2006.01)
*H01L 23/31* (2006.01)

(52) U.S. Cl.
CPC ......... *H01L 23/3735* (2013.01); *H01L 23/473* (2013.01); *H01L 23/488* (2013.01); *H01L 24/29* (2013.01); *H01L 24/32* (2013.01); *H01L 23/3107* (2013.01); *H01L 2224/29005* (2013.01); *H01L 2224/29111* (2013.01); *H01L 2224/32238* (2013.01); *H01L 2224/32503* (2013.01); *H01L 2224/32507* (2013.01); *H01L 2224/83447* (2013.01); *H01L 2224/83801* (2013.01); *H01L 2924/01322* (2013.01); *H01L 2924/13055* (2013.01); *H01L 2924/3512* (2013.01)

(56) References Cited

U.S. PATENT DOCUMENTS

| | | | |
|---|---|---|---|
| 2005/0077617 | A1 | 4/2005 | Hirano et al. |
| 2007/0274047 | A1* | 11/2007 | Nagase ............... H01L 23/3735 361/704 |
| 2009/0229864 | A1* | 9/2009 | Kuromitsu .......... H01L 23/3735 174/252 |
| 2009/0267215 | A1* | 10/2009 | Kitahara ............. H01L 23/3735 257/691 |

FOREIGN PATENT DOCUMENTS

| | | |
|---|---|---|
| JP | 2004-172378 A | 6/2004 |
| JP | 2005-116963 A | 4/2005 |
| JP | 2006-066716 A | 3/2006 |
| JP | 2006-289434 A | 10/2006 |
| JP | 2008-098212 A | 4/2008 |
| JP | 2008-227336 A | 9/2008 |
| JP | 2009-076611 A | 4/2009 |
| JP | 2010-087072 A | 4/2010 |
| JP | 2011-143442 A | 7/2011 |
| WO | WO-2009/051255 A1 | 4/2009 |

OTHER PUBLICATIONS

K. Nogita et al., "Inhibition of Cracking in Cu6Sn5 Intermetallic Compounds at Sn—Cu Lead-Free Solders and Cu Substrate Interfaces", International Conference on Electronics Packaging (ICEP) 2009, [online], Apr. 16, 2009, pp. 1 to 6.

International Search Report mailed Mar. 25, 2014, issued for PCT/JP2013/084329 and English translation thereof.

Office Action mailed Jul. 15, 2014, issued for the Japanese patent application No. 2013-264216 and English translation thereof.

Kazuhiro Nogita et al., "Inhibiting Cracking of Interfacial $Cu_6Sn_5$ by Ni Additions to Sn-based Lead-free Solders", Transactions of the Japan Institute of Electronics Packaging, vol. 2 No. 1, Jan. 1, 2009, pp. 46-54.

Hiroshi Nishikawa et al., "Interfacial Reaction between Sn—0.7Cu (-Ni) Solder and Cu Substrate", Journal of Electronic Materials, vol. 35, No. 5, May 1, 2006, pp. 1127-1132.

Petr Harcuba et al., "Microstructure Changes and Physical Properties of the Intermetallic Compounds Formed at the Interface Between Sn—Cu Solders and a Cu Substrate Due to a Minor Addition of Ni", Journal of Electronic Materials., vol. 39, No. 12, Sep. 14, 2010, pp. 2553-2557.

Supplementary European Search Report mailed Jul. 14, 2016, issued for the European Patent Application No. 13868335.4.

* cited by examiner

POWER MODULE

CROSS REFERENCE TO RELATED APPLICATIONS

This application is related to co-pending application: "POWER MODULE" filed even date herewith in the names of Touyou OHASHI, Yoshiyuki NAGATOMO, Toshiyuki NAGASE and Yoshirou KUROMITSU as a national phase entry of PCT/JP2013/084257, which application is assigned to the assignee of the present application and is incorporated by reference herein.

FIELD OF THE INVENTION

The present invention relates to a power module obtained by bonding a circuit layer including a copper layer composed of copper or a copper alloy to a semiconductor element using a solder material.

Priority is claimed on Japanese Patent Application No. 2012-281346, filed Dec. 25, 2012, the content of which is incorporated herein by reference.

BACKGROUND OF THE INVENTION

For example, as disclosed in PTLs 1 and 2, the aforementioned power module includes a power module substrate obtained by bonding a metal plate to be a circuit layer onto one surface of an insulating substrate, and a power device (semiconductor element) mounted on the circuit layer. In addition, a heat sink such as a radiator plate or a cooler is provided on the other surface of the power module substrate to radiate heat from the power device (semiconductor element) in some cases. At this time, in order to alleviate the thermal stress caused by thermal expansion coefficients of the insulating substrate and the heat sink such as a radiator plate or a cooler, the power module substrate is configured such that a metal plate to be the metal layer is bonded onto the other surface of the insulating substrate and the metal layer and the aforementioned heat sink such as a radiator plate or a cooler are bonded to each other.

In the aforementioned power module, the circuit layer and the power device (semiconductor element) are bonded through the solder material.

Here, when the circuit layer is composed of aluminum or an aluminum alloy, for example, as disclosed in PTL 3, it is necessary to form a Ni plating film on the surface of the circuit layer by electroplating or the like and provide the solder material on the Ni plating film to bond the semiconductor element to the circuit layer.

In addition, when the circuit layer is composed of copper or a copper alloy, a Ni plating film is formed on the surface of the circuit layer and the solder material is provided on the Ni plating film to bond the semiconductor element to the circuit layer.

RELATED ART DOCUMENT

Patent Literature

[PTL 1] Japanese Unexamined Patent Application, First Publication No. 2002-076551
[PTL 2] Japanese Unexamined Patent Application, First Publication No. 2008-227336
[PTL 3] Japanese Unexamined Patent Application, First Publication No. 2004-172378

Problems to be Solved by the Present Invention

However, for example, as described in PTL 3, when a power cycle is loaded on the power module in which the semiconductor element is bonded onto the circuit layer by soldering by forming the Ni plating film on the surface of the circuit layer composed of aluminum or an aluminum alloy, cracks are initiated in the solder and the thermal resistance is likely to increase.

In addition, when a power cycle is loaded on the power module in which the semiconductor element is bonded to the circuit layer by soldering by forming the Ni plating film on the surface of the circuit layer composed of copper or a copper alloy, cracks are initiated in the solder and the thermal resistance is likely to increase.

In recent years, in usage of the above-described power module or the like, a power device for controlling an even larger amount of electric power is mounted in order to control wind power generators, electric vehicles, and electric automobiles. Thus, it is necessary to further improve the reliability of the power module with respect to the power cycle compared to ones conventionally used.

The present invention has been made in consideration of the above-described circumstances and an object thereof is to provide a power module capable of suppressing the occurrence of breakage of a solder layer even when a power cycle is loaded and having high reliability.

SUMMARY OF THE INVENTION

Means for Solving the Problems

As a result of an extensive investigation conducted by the present inventors, it has been found that even when a power cycle is loaded on a power module in which a semiconductor element is bonded to a circuit layer composed of aluminum, an aluminum alloy, copper or a copper alloy by soldering by forming a Ni plating film on the surface of the circuit layer, breakage occurs in the Ni plating and cracks are initiated in a solder layer using this breakage as the origin. In addition, it has been also found that the interface between the solder layer and the circuit layer is strengthened by forming a Sn alloy layer including Ni and Cu at the interface between the solder layer and the circuit layer and thus, the durability of the solder layer can be improved.

The present invention has been made based on the aforementioned findings.

(1) According to an aspect of the present invention, a power module is provided including: a power module substrate provided with a circuit layer on one surface of an insulating layer; and a semiconductor element bonded onto the circuit layer, wherein a copper layer composed of copper or a copper alloy is provided on the surface of the circuit layer onto which the semiconductor element is bonded, a solder layer formed by using a solder material is formed between the circuit layer and the semiconductor element, an alloy layer containing Sn as a main component, 0.5% by mass or more and 10% by mass or less of Ni, and 30% by mass or more and 40% by mass or less of Cu is formed at an interface between the solder layer and the circuit layer, a thickness of the alloy layer is set to be within a range of 2 $\mu$m or more and 20 $\mu$m or less, and a thermal resistance increase rate is less than 10% after loading a power cycles 100,000 times under a condition where an energization time is 5 seconds and a temperature difference is 80° C. in a power cycle test.

According to the power module having this configuration, since an alloy layer containing Sn as a main component, 0.5% by mass or more and 10% by mass or less of Ni, and 30% by mass or more and 40% by mass or less of Cu is formed at the interface between the solder layer and the circuit layer (the above-described copper layer), the interface between the solder layer and the circuit layer (the above-described copper layer) is strengthened and the durability of the solder layer can be improved.

When the content of Ni is less than 0.5% by mass, the alloy layer is thermally unstable and the alloy layer is likely to function as a starting point of the breakage of the solder layer. In addition, when the content of Ni is more than 10% by mass, an intermetallic compound such as $Ni_3Sn_4$ or the like, which is thermally unstable, is formed and the compound is likely to function as a starting point of the breakage of the solder layer.

When the content of Cu is less than 30% by mass, the thickness of the alloy layer may be less than 2 µm, and when the content of Cu is more than 40% by mass, the thickness of the alloy layer is likely to be more than 20 µm.

Here, when the thickness of the alloy layer is less than 2 µm, the interface between the solder layer and the circuit layer (the above-described copper layer) is not likely to be sufficiently strengthened. On the other hand, when the thickness of the alloy layer is more than 20 µm, breakage or the like occurs in the alloy layer and the alloy layer is likely to function as a starting point of the breakage of the solder layer. Then, the thickness of the alloy layer is set to be within a range of 2 µm or more and 20 µm or less.

Further, in the power module of the present invention, since a thermal resistance increase rate is less than 10% after loading a power cycles 100,000 times under a condition where an energization time is 5 seconds and a temperature difference is 80° C. in a power cycle test, even in a case in which the power cycles is loaded in a repeated manner, the solder layer is not broken at an early stage and the reliability with respect to the power cycle can be improved. Since a condition in which the maximum load is applied to the solder layer is set in the above-described power cycle test, as long as the thermal resistance increase rate when the power cycle is loaded 100,000 times under the condition is less than 10%, sufficient reliability can be obtained in normal use.

(2) In the power module according to (1), the alloy layer includes an intermetallic compound composed of $(Cu, Ni)_6Sn_5$.

In this case, since the alloy layer includes an intermetallic compound composed of $(Cu, Ni)_6Sn_5$, the interface between the solder layer and the circuit layer (the above-described copper layer) can be sufficiently strengthened and the breakage of the solder layer during loading of a power cycle can be reliably suppressed.

Effects of the Invention

According to the present invention, it is possible to provide a power module capable of suppressing the occurrence of breakage of a solder layer at an early stage even when a power cycle is loaded, and having high reliability.

DETAILED DESCRIPTION OF THE INVENTION

Hereinafter, a power module which is an embodiment of the present invention will be described with reference to the attached drawings.

(First Embodiment)

Figure 1:
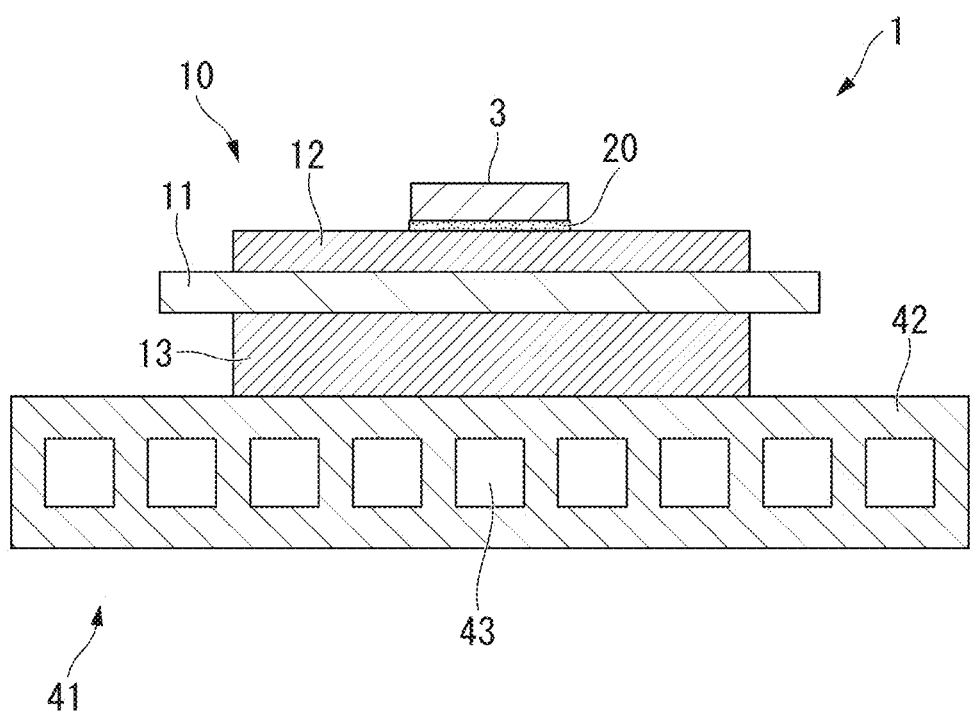
FIG. 1 is a schematic explanatory diagram of a power module which is the first embodiment of the present invention.

In FIG. 1, a power module 1 which is the first embodiment of the present invention is shown. The power module 1 includes a power module substrate 10 in which a circuit layer 12 is provided on one surface (first surface) of an insulating substrate (insulating layer) 11, and a semiconductor element 3 that is mounted on the circuit layer 12 (the upper surface in FIG. 1). In the power module 1 of the embodiment, a heat sink 41 is bonded onto the other surface of the insulating substrate 11 (which is the second surface and the lower surface in FIG. 1).

The power module substrate 10 includes the insulating substrate 11 that forms the insulating layer, the circuit layer 12 that is provided on one surface of the insulating substrate 11 (which is the first surface and the upper surface in FIG. 1), and a metal layer 13 that is provided on the other surface of the insulating substrate 11 (which is the second surface and the lower surface in FIG. 1).

The insulating substrate 11 prevents electrical connection between the circuit layer 12 and the metal layer 13 and is composed of ceramics having a high degree of insulation such as AlN (aluminum nitride), $Si_3N_4$ (silicon nitride), or $Al_2O_3$ (alumina), and in the embodiment, the insulating substrate 11 is composed of AlN (aluminum nitride). In addition, the thickness of the insulating substrate 11 is set to be within a range of 0.2 mm or more and 1.5 mm or less and is set to 0.635 mm in the embodiment.

The circuit layer 12 is formed by bonding a conductive metal plate onto the first surface of the insulating substrate 11. In the embodiment, the circuit layer 12 is formed by bonding a copper plate that is composed of a rolled plate of oxygen-free copper to the insulating substrate 11. In the embodiment, the entire circuit layer 12 corresponds to a copper layer composed of copper or a copper alloy provided on the bonding surface with the semiconductor element 3. Here, the thickness of the circuit layer 12 (the thickness of the copper plate) is preferably set to be within a range of 0.1 mm or more and 1.0 mm or less.

The metal layer 13 is formed by bonding a metal plate onto the second surface of the insulating substrate 11. In the embodiment, the metal layer 13 is formed by bonding an aluminum plate formed with a rolled plate of aluminum (so-called 4N aluminum) having purity of 99.99% by mass to the insulating substrate 11. Here, the thickness of the metal layer 13 (aluminum plate) is preferably set to be within a range of 0.6 mm or more and 3.0 mm or less.

The heat sink 41 is used for cooling the aforementioned power module substrate 10 and includes a top plate portion 42 to be bonded with the power module substrate 10, and a flow passage 43 in which a cooling medium (for example, cooling water) flows. The heat sink 41 (top plate portion 42) is desirably composed of a material having excellent thermal conductivity and is composed of aluminum material of A6063 (aluminum alloy) in the embodiment.

Figure 2:
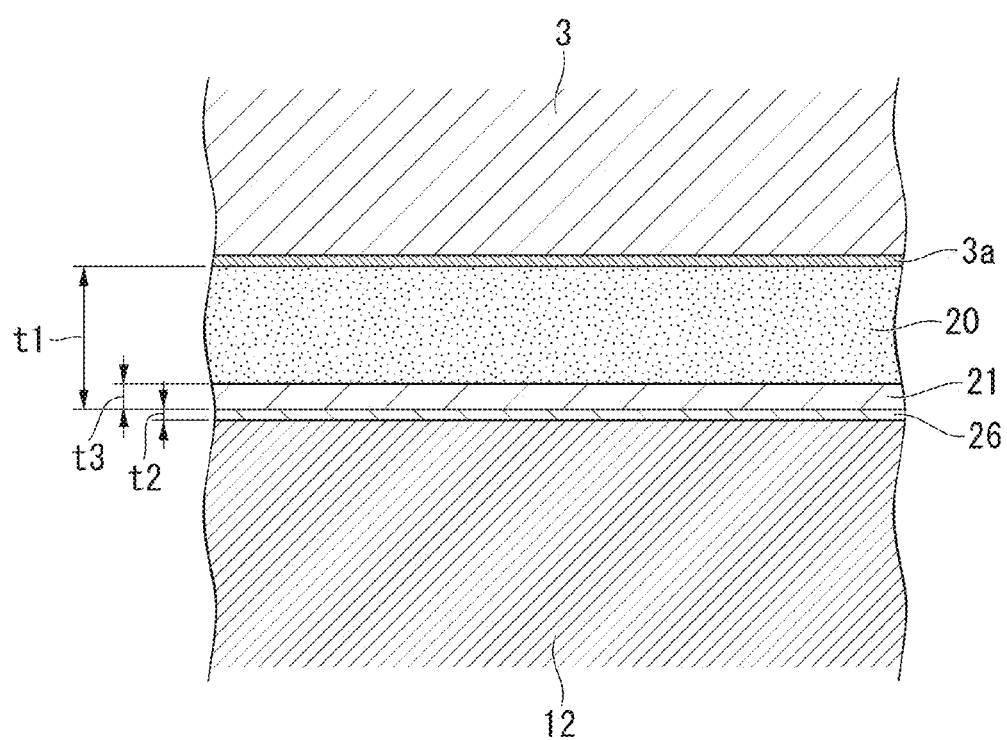
FIG. 2 is an enlarged explanatory diagram of a portion in which a circuit layer and a semiconductor element are bonded to each other in FIG. 1.

The semiconductor element 3 is composed of a semiconductor material such as Si and as shown in FIG. 2, a surface treatment film 3a composed of Ni, Au, and the like is formed on the surface to be bonded with the circuit layer 12.

In the power module 1 which is the present embodiment, the circuit layer 12 and the semiconductor element 3 are bonded to each other by soldering and a solder layer 20 is formed between the circuit layer 12 and the semiconductor element 3. In the embodiment, the thickness t1 of the solder layer 20 is set to be within a range of 50 μm or more and 200 μm or less.

Figure 4:
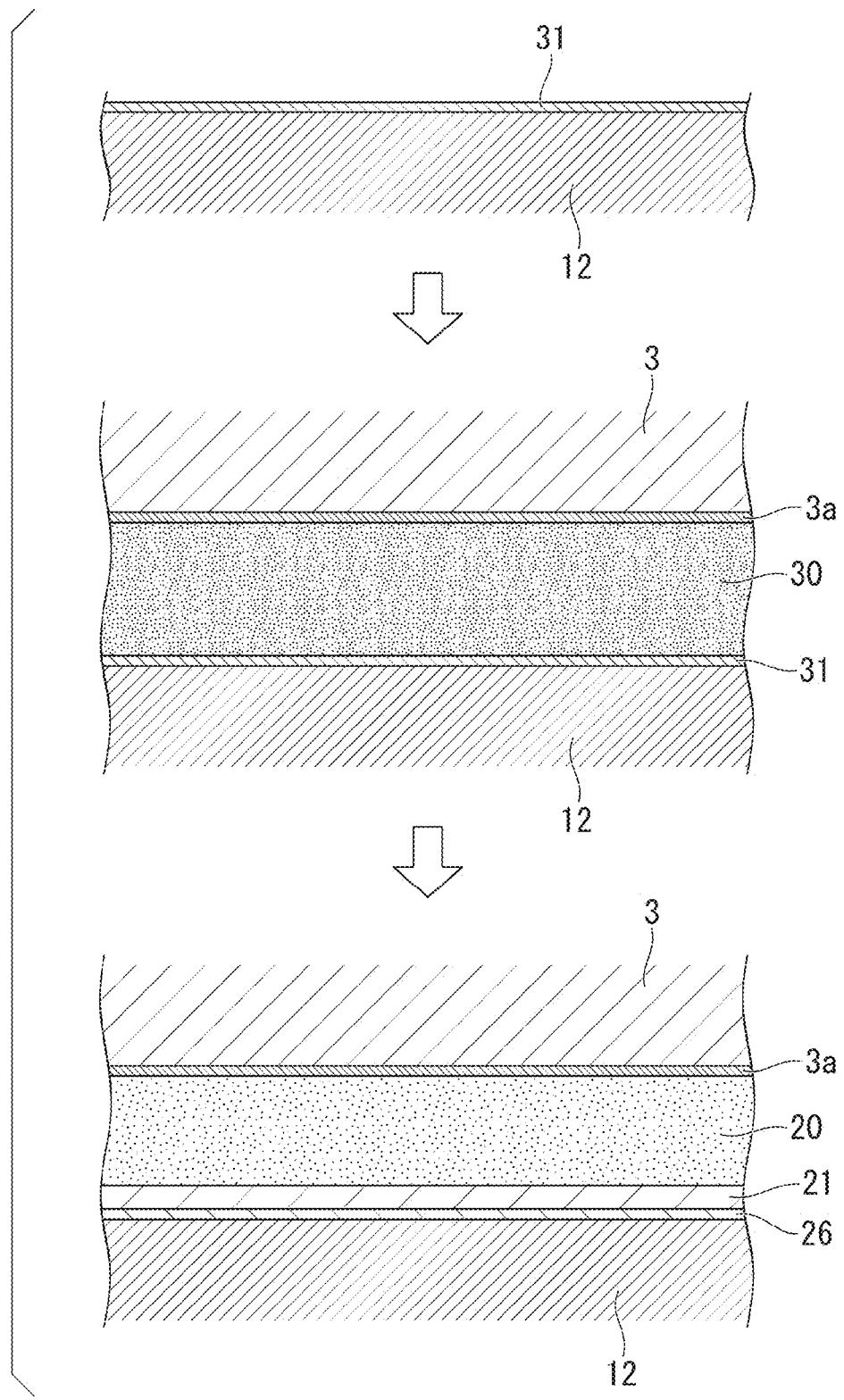
FIG. 4 is an explanatory diagram of a semiconductor element bonding step in the method of producing the power module shown in FIG. 3.

As shown in FIG. 4, the solder layer 20 is formed by using a Sn—Cu—Ni-based solder material 30 and in the embodiment, a solder material 30 composed of a Sn-0.1% by mass to 4% by mass Cu-0.01% by mass to 1% by mass Ni alloy is used.

Here, as shown in FIG. 2, an intermetallic compound layer 26 is formed on the surface of the circuit layer 12 and the solder layer 20 is provided on the intermetallic compound layer 26 in a laminated arrangement. Here, the intermetallic compound layer 26 is composed of an intermetallic compound ($Cu_3Sn$) of Cu and Sn. In addition, the thickness t2 of the intermetallic compound layer 26 is set to 0.8 μm or less.

An alloy layer 21 which has a composition containing Sn as a main component, 0.5% by mass or more and 10% by mass or less of Ni, and 30% by mass or more and 40% by mass or less of Cu is formed at the interface between the solder layer 20 and the circuit layer 12 and the thickness t3 of the alloy layer 21 is set to be within a range of 2 or more and 20 μm or less.

Here, in the embodiment, the alloy layer 21 includes an intermetallic compound composed of $(Cu, Ni)_6Sn_5$.

In the power module 1, which is the present embodiment, a thermal resistance increase rate is less than 10% after loading a power cycles 100,000 times under a condition where an energization time is 5 seconds and a temperature difference is 80° C. in a power cycle test.

Specifically, as the semiconductor element 3, an IGBT device is soldered to the circuit layer 12 and a connection wire composed of an aluminum alloy is bonded to the circuit layer. Then, electric conduction to the IGBT device is controlled to repeat a cycle in which the temperature of the device surface when the current is applied (ON) reaches 140° C. and the temperature of the device surface when the current is not applied (OFF) reaches 60° C. at an interval of 10 seconds, and after the power cycle is repeated 100,000 times, the thermal resistance increase rate is less than 10%.

Figure 3:
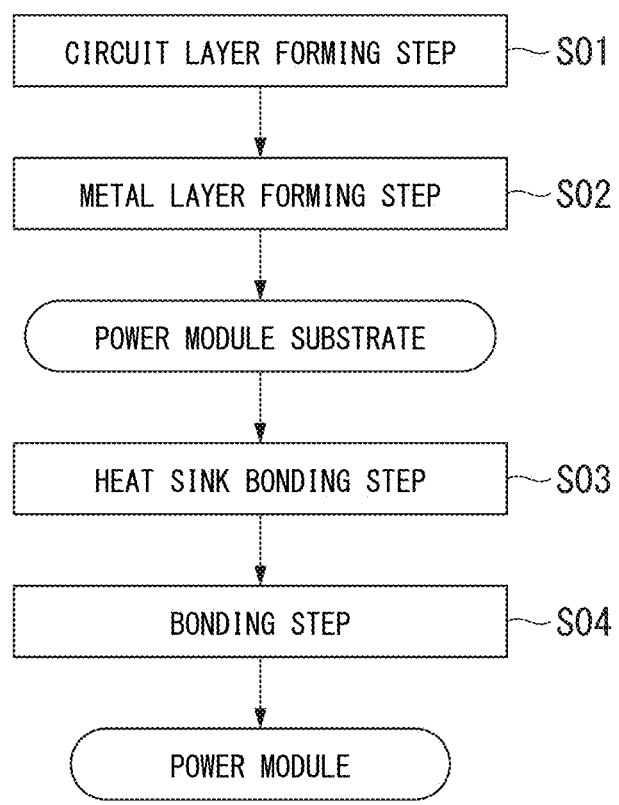
FIG. 3 is a flow diagram showing a method of producing the power module in FIG. 1.

The method of producing the power module, which is the present embodiment, will be described with reference to the flow diagram in FIG. 3 below.

First, a copper plate to be the circuit layer 12 and the insulating substrate 11 are bonded (circuit layer forming step S01). Here, the insulating substrate 11 and the copper plate to be the circuit layer 12 are bonded by a so-called active metal brazing method. In the embodiment, an active brazing material composed of: Ag-27.4% by mass; and Cu-2.0% by mass Ti alloy is used.

The copper plate to be the circuit layer 12 is laminated on the first surface of the insulating substrate 11 through the active brazing material and the insulating substrate 11 and the copper plate are put into a heating furnace and are heated therein in a state in which the copper plate and the insulating substrate are compressed in a lamination direction at a pressure of 1 kgf/cm² to 35 kg f/cm² ($9.8 \times 10^4$ Pa or more and $343 \times 10^4$ Pa or less) to bond the copper plate to be the circuit layer 12 and the insulating substrate 11. Here, the heating temperature is set to 850° C. and the heating time is set to 10 minutes.

Next, an aluminum plate to be the metal layer 13 is bonded onto the second surface of the insulating substrate 11 (metal layer forming step S02). The aluminum plate is laminated on the insulating substrate 11 through a brazing material and the insulating substrate 11 and the aluminum plate are bonded by brazing. At this time, as the brazing material, for example, an Al—Si-based brazing material foil having a thickness of 20 μm to 110 μm can be used and the brazing temperature is preferably set to 600° C. to 620° C.

Accordingly, the power module substrate 10 is produced.

Next, the heat sink 41 is bonded onto the other surface of the metal layer 13 (heat sink bonding step S03). The second surface of the insulating substrate 11 is bonded onto one surface of the metal layer 13. The metal layer 13 is laminated on the top plate portion 42 of the heat sink 41 though a brazing material and the metal layer 13 and the heat sink 41 are bonded by brazing. At this time, as the brazing material, for example, an Al—Si-based brazing material foil having a thickness of 20 μm to 110 μm can be used and the brazing temperature is preferably set to 590° C. to 610° C.

Then, the semiconductor element 3 is bonded onto the circuit layer 12 (semiconductor element bonding step S04). In the embodiment, as shown in FIG. 4, a thin Ni plating film 31 having a thickness of about 0 μm to 0.2 μm is formed on the surface of the circuit layer 12.

Next, the semiconductor element 3 is laminated on the Ni plating film 31 through a solder material 30 of a Sn-0.1% by mass to 4% by mass Cu-0.01% by mass to 1% by mass Ni alloy.

The semiconductor element and the Ni plating film are put into a reducing furnace in a state in which the semiconductor element 3 is laminated on the Ni plating film to bond the circuit layer 12 and the semiconductor element 3. At this time, the atmosphere in the reducing furnace is set to a reducing atmosphere containing 1% by volume to 10% by volume of hydrogen, the heating temperature is set to 280° C. to 330° C., and the retaining time is set to 0.5 minutes to 2 minutes. In addition, the average cooling rate to room temperature is set to be within a range of 2° C./s to 3° C./s.

Accordingly, the power module 1, which is the present embodiment, is produced by forming the solder layer 20 between the circuit layer 12 and the semiconductor element 3.

At this time, Ni in the Ni plating film 31 that is formed on the surface of the circuit layer 12 diffuses into the solder material 30 and thus the Ni plating film 31 disappears.

In addition, Cu of the circuit layer 12 diffuses into the solder material 30 and the alloy layer 21 is formed at the interface between the solder layer 20 and the circuit layer 12. Further, the alloy layer 21 has a composition containing Sn as a main component, 0.5% by mass or more and 10% by mass or less of Ni, and 30% by mass or more and 40% by mass or less of Cu.

In the power module 1 having the above-described configuration, which is the present embodiment, since the alloy layer 21 having a composition containing Sn as a main component, 0.5% by mass or more and 10% by mass or less of Ni, and 30% by mass or more and 40% by mass or less of Cu is formed at the interface between the solder layer 20 and the circuit layer 12, the interface between the solder layer 20 and the circuit layer 12 is strengthened and breakage of the solder layer 20 can be suppressed.

Here, since the thickness of the alloy layer 21 is set to 2 μm or more, the interface between the solder layer 20 and the circuit layer 12 can be reliably strengthened. On the hand, since the thickness of the alloy layer 21 is set to 20 μm or less, it is possible to prevent the alloy layer 21 from functioning as a starting point of the breakage of the solder layer 20.

In addition, since the alloy layer 21 includes an intermetallic compound composed of $(Cu, Ni)_6Sn_5$, the interface between the solder layer 20 and the circuit layer 12 can be strengthened.

Further, in the power module 1, which is the present embodiment, since the number of power cycles until the thermal resistance increase rate becomes more than 10% is 100,000 times or more in a case in which a power cycle test is performed under the conditions of an energization time of 5 seconds and a temperature difference of 80° C., the solder layer 20 is not broken at an early stage even during loading of the power cycle, and the reliability can be improved.

Further, in the embodiment, since the thin Ni plating film 31 having a thickness of 0 μm to 20 μm is formed on the surface of the circuit layer 12, the Ni plating film 31 does not remain during bonding of the semiconductor element 3 by soldering and the diffusion of Cu of the circuit layer 12 into the solder material 30 is not suppressed. Thus, the alloy layer 21 can be reliably formed at the interface between the solder layer 20 and the circuit layer 12.

(Second Embodiment)

Next, a power module which is the second embodiment of the present invention will be described with reference to attached drawings. In addition, the same members as those of the first embodiment will be given the same reference numerals, the explanation of which will be omitted here.

Figure 5:
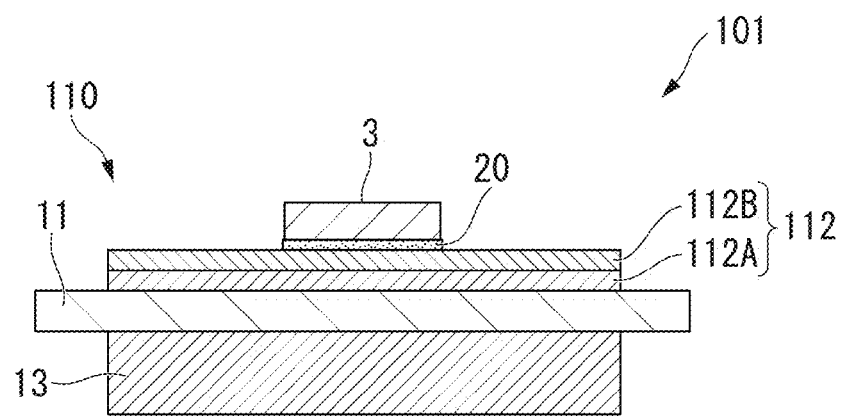
FIG. 5 is a schematic explanatory diagram of a power module which is the second embodiment of the present invention.

In FIG. 5, a power module 101 which is the second embodiment of the present invention is shown. The power module 101 includes a power module substrate 110 in which a circuit layer 112 is formed on one surface (first surface) of the insulating substrate (insulating layer) 11, and a semiconductor element 3 that is mounted on the circuit layer 112 (the upper surface in FIG. 5).

The power module substrate 110 includes the insulating substrate 11 that forms the insulating layer, the circuit layer 112 that is provided on one surface of the insulating substrate 11 (which is the first surface and the upper surface in FIG. 5), and the metal layer 13 that is provided on the other surface of the insulating substrate 11 (which is the second surface and the lower surface in FIG. 5).

As shown in FIG. 5, the circuit layer 112 includes an aluminum layer 112A that is formed on the first surface of the insulating substrate 11, and a copper layer 112B that is laminated on one surface of the aluminum layer 112A. The other surface of the aluminum layer 112A is bonded to the first surface of the insulating substrate 11.

Here, in the embodiment, the aluminum layer 112A is formed by bonding a rolled plate of aluminum having a purity of 99.99% by mass or more to the insulting substrate. In addition, the copper layer 112B is formed by bonding a copper plate composed of a rolled plate of oxygen-free copper to one surface of the aluminum layer 112A by solid-phase diffusion.

One surface of the circuit layer 112 (upper surface in FIG. 5) is a surface onto which the semiconductor element 3 is bonded. Here, the thickness of the circuit layer 112 is preferably set to be within a range of 0.25 mm or more and 6.0 mm or less. In addition, the thickness of the aluminum layer 112A (aluminum plate) is preferably set to be within a range of 0.2 mm or more and 3.0 mm or less and the thickness of the copper layer 112B is preferably set to be within a range of 50 μm or more and 3.0 mm or less.

Figure 6:
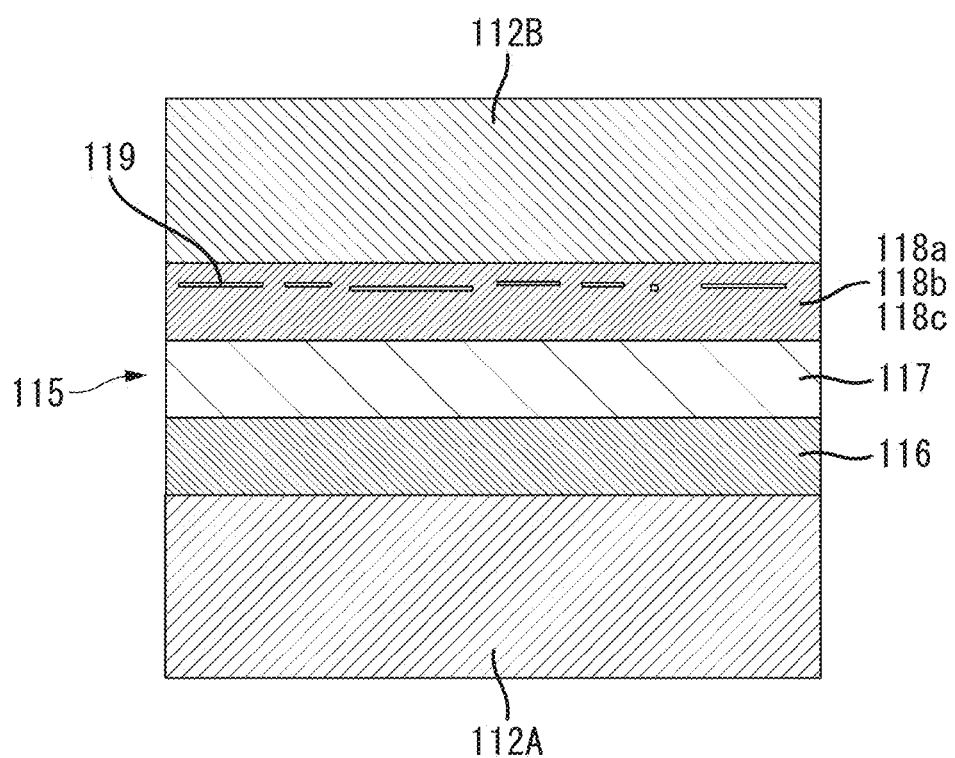
FIG. 6 is an enlarged explanatory diagram of a bonding interface between a copper layer and an aluminum layer in FIG. 5.

Here, as shown in FIG. 6, a diffusion layer 115 is formed at the interface between the aluminum layer 112A and the copper layer 112B.

The diffusion 115 is formed by mutual diffusion of Al atoms of the aluminum layer 112A and Cu atoms of the copper layer 112B. In the diffusion layer 115, a concentration gradient in which the aluminum atom concentration decreases gradually and the copper atom concentration increases from the aluminum layer 112A to the copper layer 112B is formed.

As shown in FIG. 6, the diffusion layer 115 is composed of an intermetallic compound of Al and Cu and has a structure in which multiple intermetallic compounds are laminated along the bonding interface in the embodiment. Here, the thickness of the diffusion layer 115 is set to be within a range of 1 μm or more and 80 μm or less, and preferably within a range of 5 μm or more and 80 μm or less.

Figure 7:
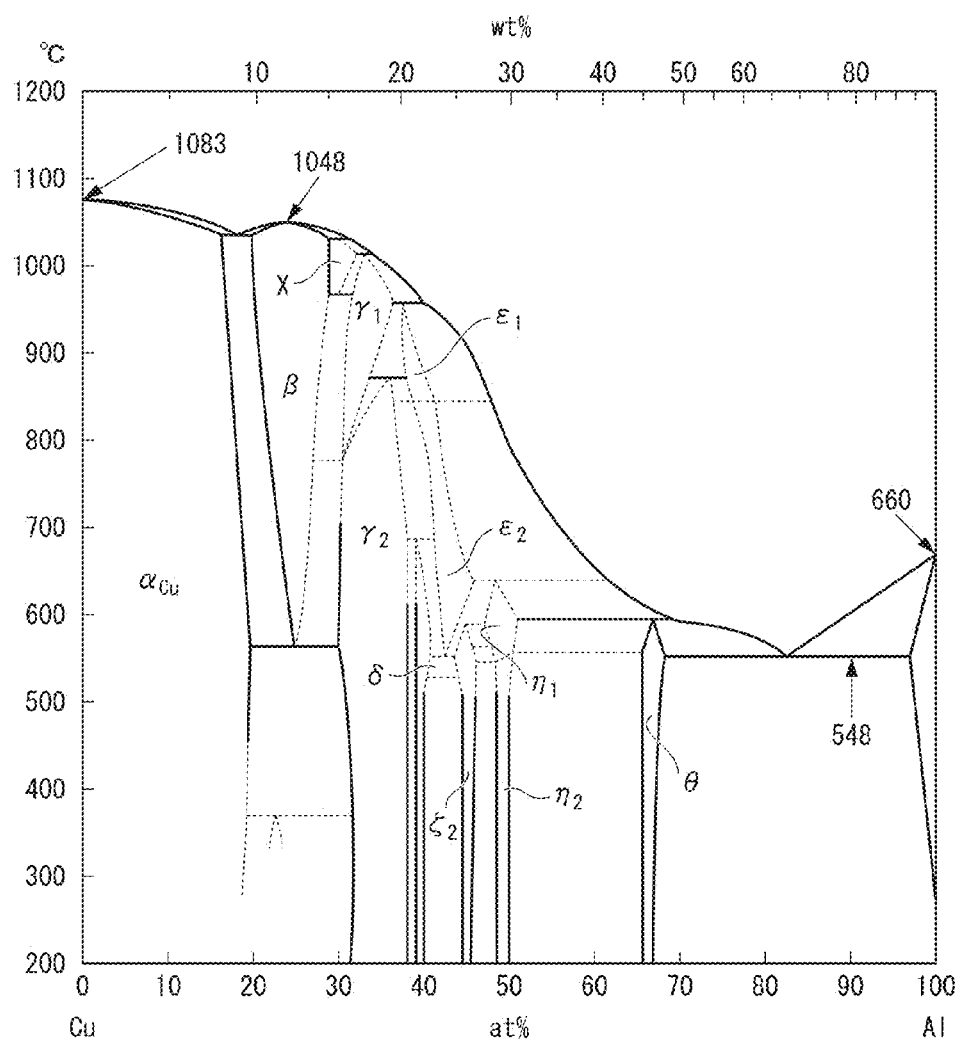
FIG. 7 is a binary phase diagram of Cu and Al.

In the embodiment, as shown in FIG. 6, a θ phase 116 and an $\eta_2$ phase 117 are laminated along the bonding interface between the aluminum layer 112A to the copper layer 112B sequentially from the aluminum layer 112A to the copper layer 112B, and further, at least one of a $\zeta_2$ phase 118a, a δ phase 118b, and a $\gamma_2$ phase 118c is laminated (refer to the phase diagram of FIG. 7).

Further, in the embodiment, along the interface between the copper layer 112B and the diffusion layer 115, an oxide 119 is dispersed in a laminated state in the layer composed of at least one of the $\zeta_2$ phase 118a, the δ phase 118b, and the $\gamma_2$ phase 118c. The oxide 119 is composed of an aluminum oxide such as alumina ($Al_2O_3$) or the like.

In the power module 101, which is the present embodiment, the circuit layer 112 (copper layer 112B) and the semiconductor element 3 are bonded by soldering and the solder layer 20 is formed between the circuit layer 112 (copper layer 112B) and the semiconductor element 3. The solder layer 20 is formed by using a Sn—Cu—Ni-based solder material as in the first embodiment and in the embodiment, a solder material of a Sn-0.1% by mass to 4% by mass Cu-0.01% by mass to 1% by mass Ni alloy is used.

Figure 8:
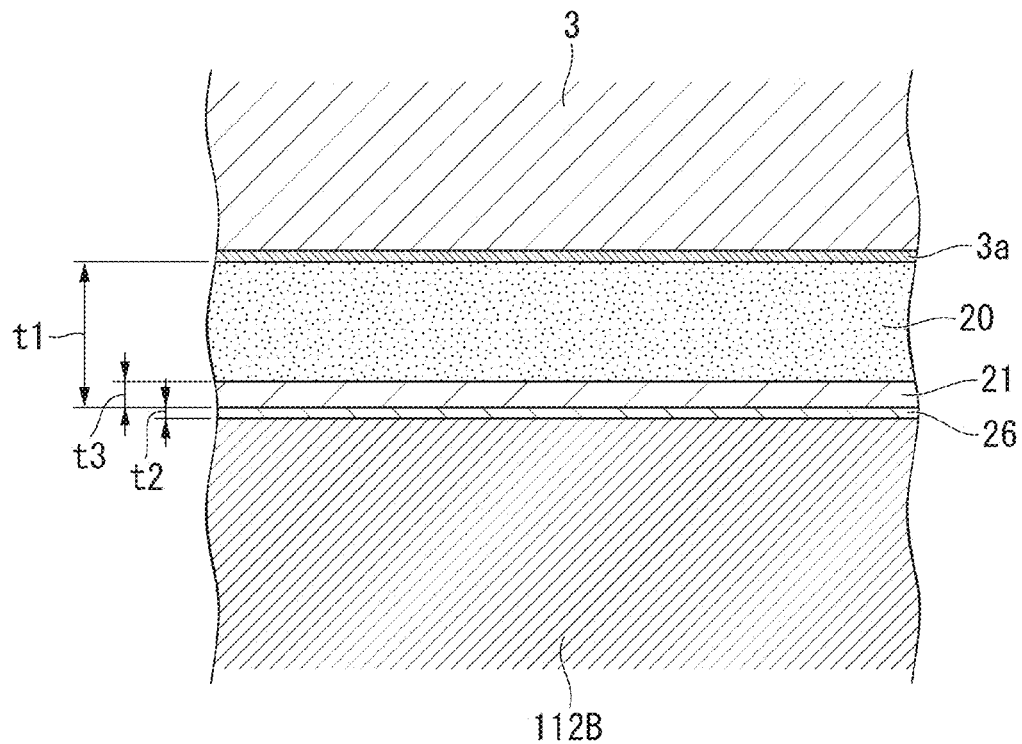
FIG. 8 is an enlarged explanatory diagram of a portion in which a circuit layer and a semiconductor element are bonded to each other in FIG. 5.

Here, as shown in FIG. 8, the intermetallic compound layer 26 is formed on the surface of the circuit layer 112 (copper layer 112B) and the solder layer 20 is provided on the intermetallic compound layer 26 in a laminated arrangement. The intermetallic compound layer 26 is composed of an intermetallic compound ($Cu_3Sn$) of Cu and Sn. The thickness t2 of the intermetallic compound layer 26 is set to 0.8 μm or less.

The alloy layer 21 which has a composition containing Sn as a main component, 0.5% by mass or more and 10% by mass or less of Ni, and 30% by mass or more and 40% by mass or less of Cu is formed at the interface between the solder layer 20 and the circuit layer 112 (copper plate 112B) and the thickness t3 of the alloy layer 21 is set to be within a range of 2 μm or more and 20 μm or less.

Here, in the embodiment, the alloy layer 21 includes an intermetallic compound composed of $(Cu, Ni)_6Sn_5$.

In the power module 101, which is the present embodiment, a thermal resistance increase rate is less than 10% after loading a power cycles 100,000 times under a condition where an energization time is 5 seconds and a temperature difference is 80° C. in a power cycle test.

Specifically, as the semiconductor element 3, an IGBT device is soldered to the circuit layer 112 (copper plate 112B) and a connection wire composed of an aluminum alloy is bonded to the circuit layer. Then, electric conduction to the IGBT device is controlled to repeat a cycle in which the temperature of the device surface when the current is applied (ON) reaches 140° C. and the temperature of the device surface when the current is not applied (OFF) reaches 60° C. at an interval of 10 seconds, and after the power cycle is repeated 100,000 times, the thermal resistance increase rate is less than 10%.

Figure 9:
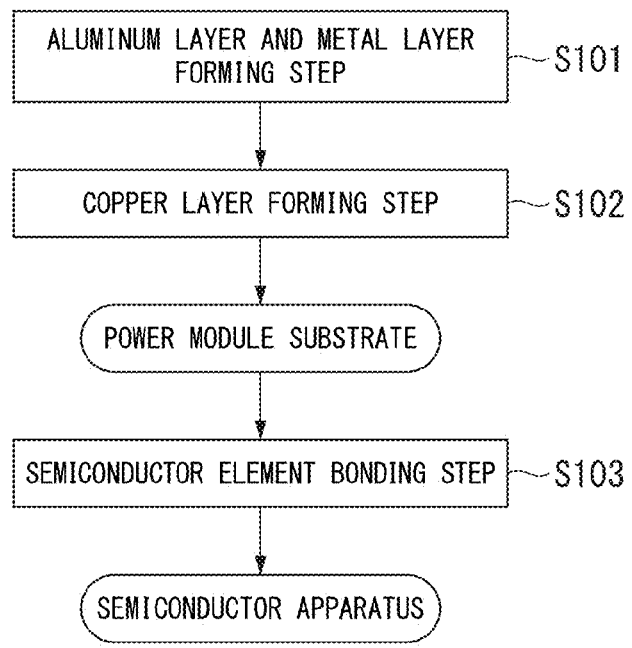
FIG. 9 is a flow diagram showing a method of producing the power module in FIG. 5.

Hereinafter, a method of producing the power module 101, which is the present embodiment, will be described using the flow diagram in FIG. 9.

First, the aluminum layer 112A and the metal layer 13 are formed by bonding the first surface of the insulating substrate 11 and the second surface of the aluminum plate (aluminum layer and metal layer forming step S101).

The aluminum plate is laminated on the insulating substrate 11 through a brazing material to bond the insulating substrate 11 and the aluminum plate by brazing. At this time, as the brazing material, for example, an Al—Si-based brazing material foil having a thickness of 20 μm to 110 μm can be used and the brazing temperature is preferably set to 600° C. to 620° C.

Next, a copper plate is bonded onto one surface of the aluminum layer 112A to form a copper layer 112B (copper layer forming step S102). In addition, the other surface of the aluminum layer 112A is a surface onto which the first surface of the insulating substrate 11 is bonded in the aluminum layer and metal layer forming step S101.

The copper plate is laminated on the aluminum layer 112A and the copper plate and the aluminum layer are put into a vacuum heating furnace and are heated therein in a state in which the copper plate and the aluminum layer are compressed in a lamination direction (at a pressure of 3 kgf/cm$^2$ to 35 kgf/cm$^2$) to bond the aluminum layer 112A and the copper plate by solid-phase diffusion. Here, in the copper layer forming step S102, the heating temperature is set to 400° C. or higher and 548° C. or lower and the heating time is set to 15 minutes or more and 270 minutes or less. When the aluminum layer 112A and the copper plate are bonded by solid-phase diffusion, the heating temperature is preferably set to be within a range from a temperature 5° C. lower than the eutectic temperature (548.8° C.) of Al and Cu to a temperature lower than the eutectic temperature.

Through the copper layer forming step S102, the circuit layer 112 composed of the aluminum layer 112A and the copper layer 112B is formed on the first surface of the insulating substrate 11.

The semiconductor element 3 is bonded onto the circuit layer 112 (copper layer 112B) (semiconductor element bonding step S103). In the embodiment, a thin Ni plating film having a thickness of 0.2 μm or less is formed on the surface of the circuit layer 112 (copper layer 112B).

Next, the semiconductor element 3 is laminated on the Ni plating film through the solder material of a Sn-0.1% by mass to 4% by mass Cu-0.01% by mass to 1% by mass Ni alloy.

In a state in which the semiconductor element 3 is laminated on the Ni plating film, the semiconductor element and the circuit layer are put into a reducing furnace and the circuit layer 112 (copper layer 112B) and the semiconductor element 3 are bonded by soldering. At this time, the atmosphere in the reducing furnace is set to a reducing atmosphere containing 1% by volume to 10% by volume of hydrogen, the heating temperature is set to 280° C. to 330° C., and the retaining time is set to 0.5 minutes to 2 minutes. In addition, the average cooling rate to room temperature is set to be within a range of 2° C./s to 3° C./s.

Accordingly, the power module 101, which is the present embodiment, is produced by forming the solder layer 20 between the circuit layer 112 (copper layer 112B) and the semiconductor element 3.

At this time, Ni in the Ni plating film that is formed on the surface of the circuit layer 112 (copper plate 112B) diffuses into the solder material and thus the Ni plating film disappears.

In addition, Cu of the copper layer 112B diffuses into the solder material and thus precipitate particles composed of an intermetallic compound including Cu, Ni, and Sn (($Cu, Ni)_6Sn_5$ in the embodiment) are dispersed inside the solder layer 20. Further, the solder layer 20 has a composition containing Sn as a main component, 0.01% by mass or more and 1.0% by mass or less of Ni, and 0.1% by mass or more and 5.0% by mass or less of Cu.

In the power module 101 having the above-described configuration, which is the present embodiment, the same effects as in the first embodiment can be obtained.

Further, since the circuit layer 112 has the copper layer 112B in the embodiment, heat generated from the semiconductor element 3 can be spread in a plane direction by the copper layer 112B and the heat can be effectively transferred to the power module substrate 110.

Further, since the aluminum layer 112A having relatively low deformation resistance is formed on the first surface of the insulating substrate 11, the thermal resistance generated during loading of a heat cycle can be absorbed by the aluminum layer 112A and thus breakage of the insulating substrate 11 can be suppressed.

In addition, since the copper layer 112B composed of copper or a copper alloy having relatively high deformation resistance is formed on one surface of the circuit layer 112, deformation of the circuit layer 112 during loading of a heat cycle can be suppressed and thus high reliability with respect to the power cycle can be obtained. The other surface of the circuit layer 112 is a surface to be bonded with the first surface of the insulating substrate 11.

Further, since the aluminum layer 112A and the copper layer 112B are bonded by solid-phase diffusion and the temperature during the solid-phase diffusion bonding is set to 400° C. or higher in the embodiment, diffusion of Al atoms and Cu atoms is promoted and the solid-phase diffusion can be sufficiently achieved in a short period of time. In addition, since the temperature during the solid-phase diffusion is set to 548° C. or lower, it is possible to suppress formation of a bump at the bonding interface between the aluminum layer 112A and the copper layer 112B without formation of a liquid phase of Al and Cu or to suppress a change in thickness.

Further, when the heating temperature of the above-described solid-phase diffusion bonding is set to be within a range from a temperature 5° C. lower than the eutectic temperature (548.8° C.) of Al and Cu to a temperature lower than the eutectic temperature, it is possible to suppress unnecessary formation of a compound of Al and Cu. Also, the diffusion rate during solid-phase diffusion bonding is ensured and thus solid-phase diffusion bonding can be achieved in a relatively short period of time.

The embodiments of the present invention have been described above. However, the present invention is not limited thereto and may be appropriately modified without departing from the scope of the invention.

For example, the metal layer is composed of 4N aluminum having a purity of 99.99% by mass or more in the embodiment. However, there is no limitation thereto and the metal layer may be composed of other aluminum or an aluminum alloy and may be composed of copper or a copper alloy.

In addition, for example, a rolled plate of oxygen-free copper is used as the metal layer to be the circuit layer in the embodiments. However, there is no limitation thereto and the metal layer may be composed of copper or a copper alloy.

Further, an insulating substrate composed of AlN is used as the insulating layer. However, there is no limitation thereto and an insulating substrate composed of $Al_2O_3$, $Si_3N_4$, or the like may be used.

In addition, the insulating substrate and the copper plate to be the circuit layer are bonded by the active metal brazing material method. However, there is no limitation thereto and the insulating substrate and the copper plate may be bonded by a DBC method, a casting method, or the like.

Further, the insulating substrate and the aluminum plate to be the metal layer are bonded by brazing. However, there is no limitation thereto and a transient liquid phase bonding method, a metal paste method, a casting method, or the like may be applied.

Furthermore, the composition of the solder material is not limited to the embodiment and the composition of the alloy layer formed after solder bonding may contain Sn as a main component, 0.5% by mass or more and 10% by mass or less of Ni, and 30% by mass or more and 40% by mass or less of Cu.

In the second embodiment, the copper plate is bonded onto the first surface of the aluminum layer by solid-phase diffusion bonding to form the copper layer on the bonding surface of the circuit layer. However, there is no limitation thereto and the method of forming the copper layer is not limited.

For example, the copper layer may be formed on one surface of the aluminum layer by a plating method. When a copper layer having a thickness of about 5 µm to 50 µm is formed, a plating method is preferably used. When a copper layer having a thickness of about 50 µm to 3 mm is formed, solid-phase diffusion bonding is preferably used.

Example 1

Hereinafter, description will be made with respect to results of confirmation experiments that have been performed to confirm effectiveness of the present invention.

A power module described in the aforementioned first embodiment was prepared. As the insulating substrate, a substrate composed of AlN having a size of 27 mm×17 mm and a thickness of 0.6 mm was used. In addition, as the circuit layer, a plate composed of oxygen-free copper and having a size of 25 mm×15 mm and a thickness of 0.3 mm was used. As the metal layer, a plate composed of 4N aluminum and having a size of 25 mm×15 mm and a thickness of 0.6 mm was used. As the semiconductor element, an IGBT device having a size of 13 mm×10 mm and a thickness of 0.25 mm was used. As the heat sink, an aluminum plate (A6063) having a size of 40.0 mm×40.0 mm×2.5 mm was used.

Here, the composition of the alloy layer after solder bonding, the thickness of the alloy layer, and the like were adjusted by adjusting the thickness of the Ni plating film formed on the surface of the circuit layer and changing the composition of the solder material as shown in Table 1 and thus various power modules of Examples 1 to 8 and Comparative Examples 1 to 6 were prepared.

As for the conditions for solder bonding, a reducing atmosphere containing 3% volume of hydrogen was set, the heating temperature (heating target temperature) and the retaining time were set as conditions of Table 1, and the average cooling rate to room temperature was set to 2.5° C./s.

(Composition of Alloy Layer)

In the power modules obtained as described above, the component analysis of the alloy layer formed at the interface between the solder layer and the circuit layer was performed by EPMA analysis. In the embodiment, using an EPMA system (JXA-8530F, manufactured by JEOL Ltd.), the average composition of the alloy layer was analyzed at an acceleration voltage of 15 kV, a spot diameter of 1 µm or less, and a magnification of 250 times.

(Thickness of Alloy Layer)

In addition, the thickness of the alloy layer formed at the interface between the solder layer and the circuit layer was measured. An EPMA mapping was obtained using the aforementioned EPMA system, and the area of the alloy layer including an intermetallic compound composed of $(Cu, Ni)_6Sn_5$, which was continuously formed at the interface with the circuit layer, was measured and divided by the size of the width of the mapping to obtain the thickness. The area of the alloy layer excluding a region not continuously formed from the interface with the circuit layer in the thickness direction in the alloy layer formed at the interface with the circuit layer was measured. Further, since the thickness of the intermetallic compound layer composed of $Cu_3Sn$ was made extremely thin compared to that of the alloy layer, the thickness from the surface of the circuit layer was measured as the thickness of the alloy layer. The results of EPMA mapping of Comparative Example 5 and Example 1 are shown in FIG. 5.

(Power Cycle Test)

The electric conduction to the IGBT device was controlled to repeat a cycle in which the temperature of the device surface when the current was applied (ON) reached 140° C. and the temperature of the device surface when the current was not applied (OFF) reached 60° C. at an interval of 10 seconds, and the power cycle was repeated 100,000 times. Then, the thermal resistance increase rate from the initial state was evaluated. In all Examples 1 to 5, the thermal resistance increase rate when the power cycle was repeated 100,000 times was less than 10% or less.

(Power Cycle Life)

The electric conduction to the IGBT device was controlled to repeat a cycle in which the temperature of the device surface when the current was applied (ON) reached 140° C. and the temperature of the device surface when the current was not applied (OFF) reached 60° C. at an interval of 10 seconds, and the power cycle was repeated. Then, the number of power cycles when the increase rate of thermal resistance from the initial state reached 10% or more (power cycle life) was evaluated.

(Thermal Resistance Measurement)

As the thermal resistance, a transient thermal resistance was measured by using a thermal resistance tester (model 4324-KT, manufactured by TESEC Corporation). The thermal resistance was obtained by measuring a voltage difference between the gate and the emitter after power application while setting the application power to 100 W and the application duration to 100 ms. The measurement was performed in every 10,000$^{th}$ cycle in the aforementioned power cycle test.

As described above, according to Examples, it was confirmed that a power module having excellent power cycle properties could be obtained.

Example 2

Next, the power module having a circuit layer composed of an aluminum layer and a copper layer as described in the second embodiment was prepared.

As the insulating substrate, a substrate composed of AlN having a size of 27 mm×17 mm and a thickness of 0.6 mm was used. As the metal layer, a plate composed of 4N aluminum and having a size of 25 mm×15 mm and a

TABLE 1

| | | Composition of solder material (% by mass) | | | Soldering | | | Composition of alloy layer (% by mass) | | | | |
|---|---|---|---|---|---|---|---|---|---|---|---|---|
| | | Ni | Cu | Sn and inevitable impurities | Soldering temperature (° C.) | retaining time (minutes) | Thickness of Ni plating (μm) | Ni | Cu | Sn and inevitable impurities | Thickness of alloy layer (μm) | Power cycle life* |
| Example | 1 | 0.04 | 2.0 | Balance | 300 | 1.5 | 0 | 0.6 | 37.0 | Balance | 9 | 120,000 |
| | 2 | 0.26 | 0.4 | Balance | 300 | 0.5 | 0 | 9.8 | 31.2 | Balance | 3 | 110,000 |
| | 3 | 0.18 | 0.4 | Balance | 280 | 0.5 | 0 | 6.6 | 30.7 | Balance | 3 | 130,000 |
| | 4 | 0.10 | 3.6 | Balance | 300 | 1.5 | 0 | 0.9 | 38.5 | Balance | 15 | 140,000 |
| | 5 | 0.16 | 0.3 | Balance | 300 | 1 | 0 | 6.7 | 32.5 | Balance | 2.5 | 120,000 |
| | 6 | 0.42 | 3.9 | Balance | 330 | 2 | 0 | 3.3 | 34.0 | Balance | 18 | 130,000 |
| | 7 | 0.03 | 0.7 | Balance | 300 | 1 | 0.2 | 2.3 | 36.7 | Balance | 4 | 170,000 |
| | 8 | 0.08 | 1.0 | Balance | 300 | 1 | 0 | 1.9 | 36.5 | Balance | 5 | 180,000 |
| Comparative Example | 1 | 0.00 | 1.0 | Balance | 300 | 1 | 0 | 0.0 | 39.0 | Balance | 5 | 70,000 |
| | 2 | 0.50 | 0.7 | Balance | 300 | 0.5 | 0 | 15.0 | 35.0 | Balance | 4 | 80,000 |
| | 3 | 0.18 | 0.2 | Balance | 280 | 0.1 | 0 | 9.0 | 24.0 | Balance | 0.5 | 80,000 |
| | 4 | 0.09 | 5.7 | Balance | 350 | 5 | 0 | 0.7 | 50.0 | Balance | 24 | 80,000 |
| | 5 | 0.03 | 0.2 | Balance | 300 | 0.5 | 5 | 9.5 | 30.5 | Balance | 0.5 | 70,000 |
| | 6 | 0.10 | 4.7 | Balance | 300 | 15 | 0 | 0.6 | 38.3 | Balance | 23 | 90,000 |

*Power cycle life: Number of cycles when the thermal resistance was increased by 10%.

Figure 10:
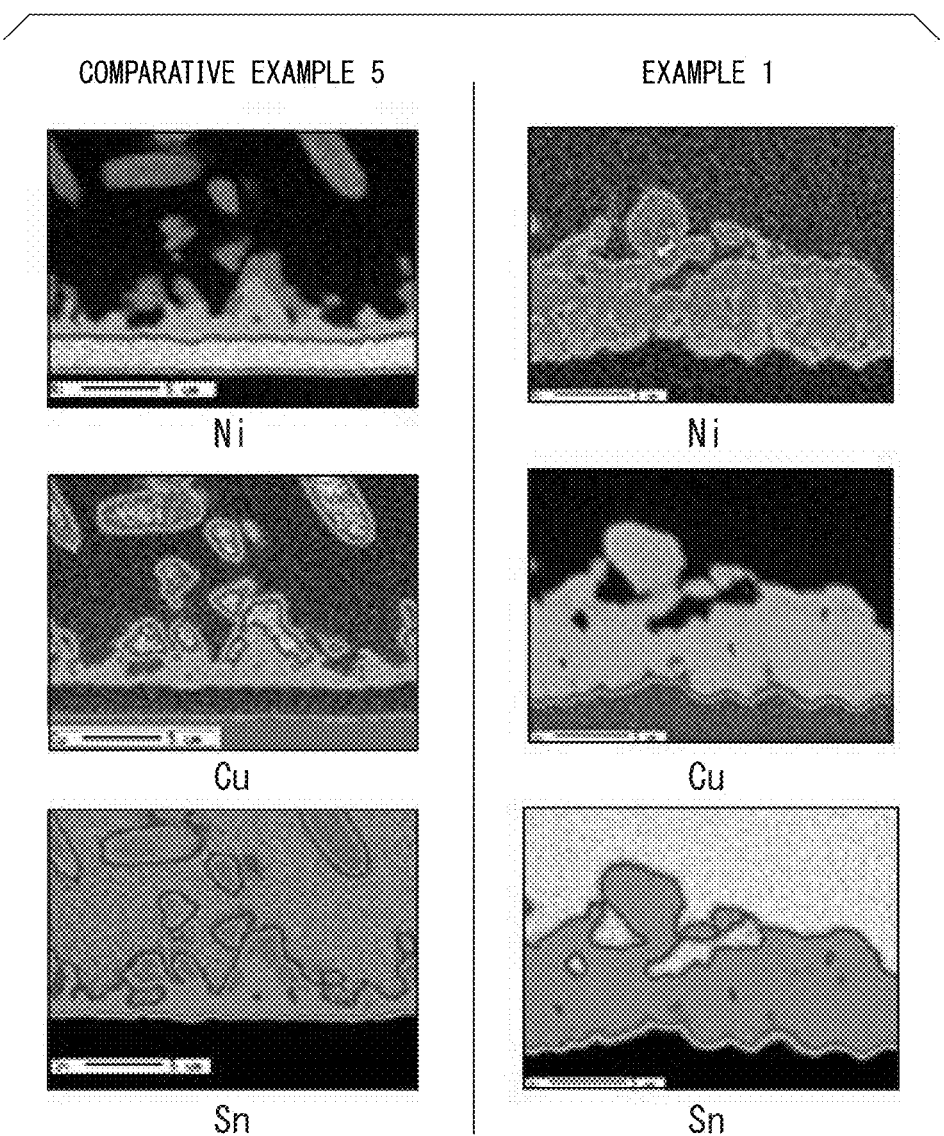
FIG. 10 shows EPMA elemental mappings of solder layers in power modules in Comparative Example 5 and Example 1.

In Comparative Example 5 in which the Ni plating film was formed on the surface of the circuit layer composed of copper, the power cycle life was 70,000 times and was short. It is assumed that this is because diffusion of Cu of the circuit layer into the solder material is interrupted by the thin Ni plating film, which leads to an insufficient amount of Cu in the solder layer and as shown in FIG. 10, the thickness of the alloy layer is thinned to less than 2 μm.

In addition, in Comparative Example 3 in which the content of Cu is set to be less than 30% by mass, the thickness of the alloy layer was thinned to less than 2 μm and thus the power cycle life was short.

Further, in Comparative Examples 4 and 6 in which the thickness of the alloy layer was set to 20 μm or more, the power cycle life was 80,000 times to 90,000 times and was short. It is assumed that this is because the thick alloy layer functions as a crack origin and breakage of the solder layer was propagated.

In addition, in Comparative Examples 1 and 2 in which the content of Ni was outside of the range of the present invention, the power cycle life was 70,000 times to 80,000 times and was short. It is assumed that this is because the alloy layer is thermally unstable.

Contrarily, in Examples 1 to 8, as shown in FIG. 10, the thickness of the alloy layer was set to 2 μm or more and 20 μm or less and the power cycle life was 110,000 times or more. It is assumed that this is because the interface with the circuit layer was strengthened by the alloy layer and breakage of the solder layer was suppressed.

thickness of 0.6 mm was used. As the semiconductor element, an IGBT device having a size of 13 mm×10 mm and a thickness of 0.25 mm was used. As the heat sink, an aluminum plate (A6063) having a size of 40.0 mm×40.0 mm×2.5 mm was used.

As the aluminum layer in the circuit layer, an aluminum layer composed of 4N aluminum and having a size of 25 mm×15 mm and a thickness of 0.6 mm was used. Then, the copper layer was formed by solid-phase diffusion bonding as shown in Table 2.

In a case of using plating, the surface of the aluminum layer was subjected to zincate treatment and then a copper layer having the thickness shown in Table 2 was formed by electrolytic plating.

In a case of using solid-phase diffusion bonding, a copper plate having the thickness shown in Table 2 was prepared and the copper plate was bonded onto the surface of the aluminum layer by solid-phase diffusion under the conditions shown in the second embodiment as an example.

As described above, various power modules of Examples 11 to 16 were prepared.

As for the conditions for solder bonding, a reducing atmosphere containing 3 volume % of hydrogen was set, the heating temperature (heating target temperature) and the retaining time were set as conditions of Table 2 and the average cooling rate to room temperature was set to 2.5° C./s.

Then, the composition of the alloy layer, the thickness of the alloy layer, and the power cycle life were evaluated by the same methods as in Example 1. The evaluation results are shown in Table 2.

TABLE 2

| | | Composition of solder material (% by mass) | | | Thickness of copper layer (mm) | Formation method of copper layer | Soldering temperature (° C.) | Soldering retaining time (minute) | Composition of alloy layer (% by mass) | | | Thickness of alloy layer (μm) | Power cycle life* |
|---|---|---|---|---|---|---|---|---|---|---|---|---|---|
| | | Ni | Cu | Sn and inevitable impurities | | | | | Ni | Cu | Sn and inevitable impurities | | |
| Example | 11 | 0.08 | 1.0 | Balance | 0.005 | Plating | 300 | 1 | 1.7 | 36.0 | Balance | 4 | 110,000 |
| | 12 | 0.08 | 1.0 | Balance | 0.01 | Plating | 300 | 1 | 1.9 | 37.0 | Balance | 3 | 120,000 |
| | 13 | 0.08 | 1.0 | Balance | 0.03 | Plating | 300 | 1 | 1.6 | 37.3 | Balance | 4 | 160,000 |
| | 14 | 0.08 | 1.0 | Balance | 0.05 | Solid-phase diffusion | 300 | 1 | 1.8 | 36.3 | Balance | 4 | 140,000 |
| | 15 | 0.08 | 1.0 | Balance | 0.3 | Solid-phase diffusion | 300 | 1 | 1.9 | 36.5 | Balance | 5 | 180,000 |
| | 16 | 0.08 | 1.0 | Balance | 3 | Solid-phase diffusion | 300 | 1 | 1.8 | 37.2 | Balance | 7 | 110,000 |

*Power cycle life: Number of cycles when the thermal resistance was increased by 10%.

As shown in Table 2, in all Examples 11 to 16, it was confirmed that the power cycle life was 110,000 times or more and breakage of the solder layer was suppressed. Even in a case in which the circuit layer was formed by forming copper layers having different thicknesses on the aluminum layer, as in Example 1, it was confirmed that the power cycle properties could be improved.

In addition, when the thickness of the copper layer was set to 5 μm or more, it was confirmed that all the Cu in the copper layer did not diffuse into the solder and the copper layer remained. Further, when the thickness of the copper layer was set to 3 mm or less, it was confirmed that the power cycle life was 100,000 times or more.

INDUSTRIAL APPLICABILITY

According to the present invention, it is possible to provide a power module capable of suppressing occurrence of breakage of a solder layer at an early stage even when a power cycle is loaded and having high reliability.

BRIEF DESCRIPTION OF THE REFERENCE SYMBOLS

1: Power module
3: Semiconductor element
10: Power module substrate
11: Insulating substrate (insulating layer)
12: Circuit layer (copper layer)
13: Metal layer
20: Solder layer
26: Intermetallic compound layer
30: Solder material
31: Ni plating film
101: Power module
112: Circuit layer
112A: Aluminum layer
112B: Copper layer

The invention claimed is:

1. A power module comprising:
a power module substrate provided with a circuit layer on one surface of an insulating layer; and
a semiconductor element bonded onto the circuit layer, wherein
a copper layer composed of copper or a copper alloy is provided on the surface of the circuit layer onto which the semiconductor element is bonded,
a solder layer formed by using a solder material is formed between the circuit layer and the semiconductor element,
an alloy layer containing Sn as a main component, 0.5% by mass or more and 10% by mass or less of Ni, and 30% by mass or more and 40% by mass or less of Cu is formed at an interface between the solder layer and the circuit layer,
a thickness of the alloy layer is set to be within a range of 2 μm or more and 20 μm or less, and
a thermal resistance increase rate is less than 10% after loading power cycles 100,000 times under the condition where an energization time is 5 seconds and a temperature difference is 80° C. in a power cycle test.

2. The power module according to claim 1, wherein the alloy layer includes an intermetallic compound composed of $(Cu,Ni)_6Sn_5$.

* * * * *